United States Patent
Yaung et al.

[11] Patent Number: 6,136,633
[45] Date of Patent: Oct. 24, 2000

[54] TRENCH-FREE BURIED CONTACT FOR LOCOS ISOLATION

[75] Inventors: Dun-Nian Yaung, Taipei; Jin-Yuan Lee; Shou-Gwo Wuu, both of Hsin-Chu, all of Taiwan

[73] Assignee: Taiwan Semiconductor Manufacturing Company, Hsin-Chu, Taiwan

[21] Appl. No.: 09/222,272

[22] Filed: Dec. 28, 1998

[51] Int. Cl.[7] .................... H01L 21/336; H01L 21/8234; H01L 21/76; H01L 21/44

[52] U.S. Cl. .......................... 438/197; 438/297; 438/439; 438/655

[58] Field of Search .................................. 438/197, 297, 438/655, 439

[56] References Cited

U.S. PATENT DOCUMENTS

| | | | |
|---|---|---|---|
| 5,292,676 | 3/1994 | Manning | 437/46 |
| 5,494,848 | 2/1996 | Chin | 437/191 |
| 5,576,242 | 11/1996 | Liu | 437/191 |
| 5,654,231 | 8/1997 | Liang et al. | 438/197 |
| 5,674,770 | 10/1997 | Lee et al. | 437/52 |
| 6,066,549 | 5/2000 | Manning . | |

Primary Examiner—John F. Niebling
Assistant Examiner—Josetta Jones
Attorney, Agent, or Firm—George O. Saile; Stephen B. Ackerman; Rosemary L. S. Pike

[57] ABSTRACT

A new method of forming an improved buried contact junction is described. A gate oxide layer is provided over the surface of a semiconductor substrate. A first polysilicon layer is deposited over the gate oxide layer. A photoresist mask is formed over the first polysilicon layer having an opening over the planned buried contact. The first polysilicon layer not covered by the photoresist mask is etched away. A portion of the photoresist mask at the edges of the opening is cut away to expose a portion of the first polysilicon layer at the edges of the opening. The gate oxide layer not covered by the mask is etched away using a reduced etching selectivity of oxide to silicon so that an upper portion of the first polysilicon layer exposed at the edges of the opening is etched away leaving a thinner first polysilicon layer at the edges of the opening. Ions are implanted through the opening and through the thinner first polysilicon layer into the semiconductor substrate to form the buried contact. The photoresist mask is removed and a second polysilicon layer is deposited overlying the first polysilicon layer and the buried contact to complete formation of the buried contact.

20 Claims, 4 Drawing Sheets

TRENCH-FREE BURIED CONTACT FOR LOCOS ISOLATION

BACKGROUND OF THE INVENTION (1) Field of the Invention

The invention relates to the fabrication of integrated circuit devices, and more particularly, to a method of avoiding a buried contact trench and reducing sheet resistance in the fabrication of integrated circuit devices.

(2) Description of the Prior Art

A typical buried contact is formed by depositing a doped layer of polysilicon over and on the planned buried contact regions and heating the structure. The buried contact regions are doped by outdiffusion of dopants from the doped polysilicon layer into the silicon substrate. The doped polysilicon layer is allowed to remain on the buried contact regions as their contacts. For submicron devices, this diffusion method does not provide adequate control. Alternatively, the buried contact regions may first be formed by ion implantation before the polysilicon layer is deposited thereover. Buried contacts are used for reduction of cell area, for example, in static random access memory (SRAM) devices. In order to reduce sheet resistance between the buried contact and the N+ source/drain, the extension of the polysilicon gate to the buried contact is very small. Hence, it is easy to induce a buried contact trench during etching of the polysilicon if there is even a slight misalignment of the mask. A buried contact trench will increase junction leakage and sheet resistance between the buried contact and the N+ source/drain.

U.S. Pat. No. 5,576,242 to Liu teaches forming a sidewall spacer in the recess of a second polysilicon layer to prevent etching of a buried contact trench. U.S. Pat. No. 5,654,231 to Liang et al teaches forming a spacer on the sidewall of the first polysilicon layer within the buried contact opening to prevent etching a trench. U.S. Pat. No. 5,494,848 to Chin discloses an enlarged photoresist mask over the buried contact area to prevent etching a trench during overetch of the polysilicon. U.S. Pat. No. 5,674,770 to Lee et al describes the split polysilicon method. U.S. Pat. No. 5,292,676 to Manning increases the buried contact implantation area by descumming the photoresist mask.

SUMMARY OF THE INVENTION

A principal object of the present invention is to provide an effective and very manufacturable method of forming a buried contact junction without forming a buried contact trench.

Another object of the present invention is to provide a method of forming a buried contact junction which will not be harmed by mask misalignment.

A further object of the present invention is to provide a method of forming a buried contact junction with an increased implantation area while maintaining the original contact area.

A still further object of the invention is to provide a method of forming a buried contact junction with a decreased polysilicon thickness through which the buried contact implant will be made.

Yet another object of the invention is to provide a method of forming a buried contact junction with a decreased polysilicon thickness through which the buried contact implant will be made by reducing the etch selectivity of oxide to silicon.

Yet another object of the present invention is to provide a method of forming a buried contact junction with improved device and isolation performance by reducing the buried contact implantation energy.

In accordance with the objects of this invention a new method of forming an improved buried contact junction is achieved. A gate oxide layer is provided over the surface of a semiconductor substrate. A first polysilicon layer is deposited over the gate oxide layer. A photoresist mask is formed over the first polysilicon layer having an opening over the planned buried contact. The first polysilicon layer not covered by the photoresist mask is etched away. A portion of the photoresist mask at the edges of the opening is cut away to expose a portion of the first polysilicon layer at the edges of the opening. The gate oxide layer not covered by the mask is etched away using a reduced etching selectivity of oxide to silicon so that an upper portion of the first polysilicon layer exposed at the edges of the opening is etched away leaving a thinner first polysilicon layer at the edges of the opening. Ions are implanted through the opening and through the thinner first polysilicon layer into the semiconductor substrate to form the buried contact. The photoresist mask is removed and a second polysilicon layer is deposited overlying the first polysilicon layer and the buried contact to complete formation of the buried contact.

BRIEF DESCRIPTION OF THE DRAWINGS

In the accompanying drawings forming a material part of this description, there is shown.

DESCRIPTION OF THE PREFERRED EMBODIMENTS

Figure 1:
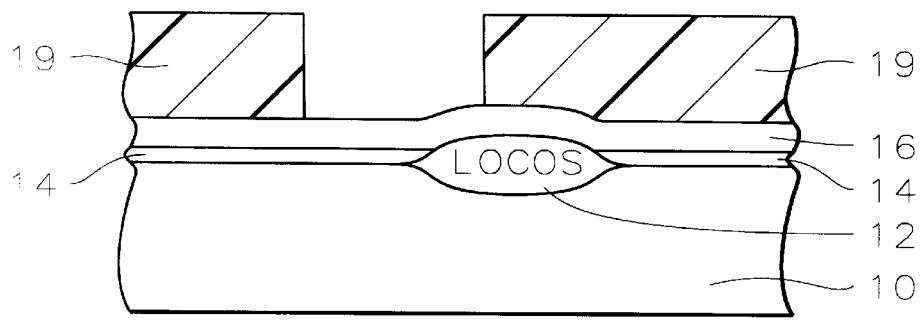
FIGS. 1 through 8 schematically illustrate in cross-sectional representation a preferred embodiment of the process of the present invention.

Referring now more particularly to FIG. 1, there is shown a portion of a partially completed integrated circuit. There is shown a monocrystalline semiconductor substrate 10 in which there are formed isolation regions, such as by LOCal Oxidation of Silicon (LOCOS) 12. A gate oxide layer 14 is grown on the surface of the semiconductor substrate, typically to a thickness of between about 70 to 80 Angstroms. The polysilicon layer 16 is blanket deposited by low pressure chemical vapor deposition (LPCVD) to a thickness of between about 500 to 600 Angstroms.

Figure 2:
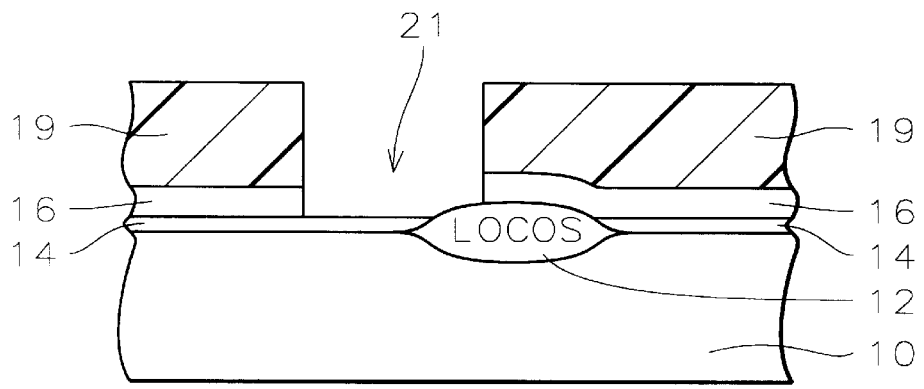

A buried contact mask is used to make a photoresist mask 19 overlying the polysilicon layer 16. The polysilicon and gate oxide layers are etched away where they are not covered by the mask to form the buried contact opening 21, illustrated in FIG. 2.

The buried contact will now be formed by ion implantation through opening 21. It is desired to increase the buried contact implantation area, but to maintain the original contact opening area so that device area will not be increased. Increasing the buried contact area will reduce the resistance of the buried contact.

Figure 3:
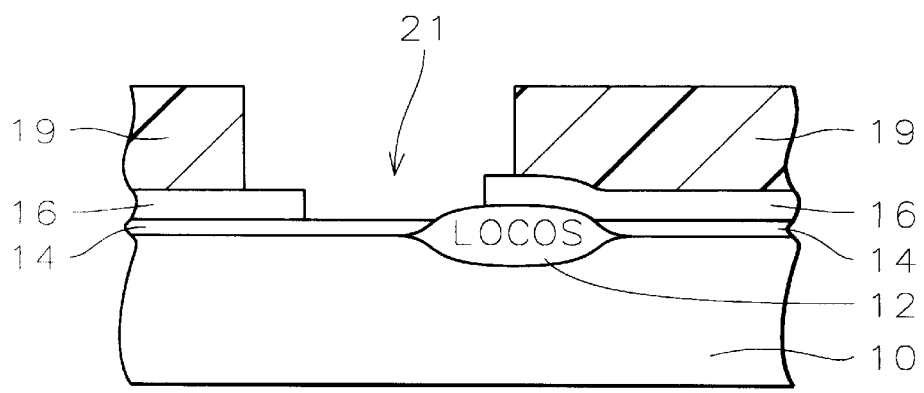

Referring now to FIG. 3, the buried contact implantation area is increased by descumming the photoresist mask. That is, the photoresist mask around the opening 21 is cut back by a small amount, about 0.05 micron per side. This is typically done by isotropic etching by a chemical treatment.

Figure 4:
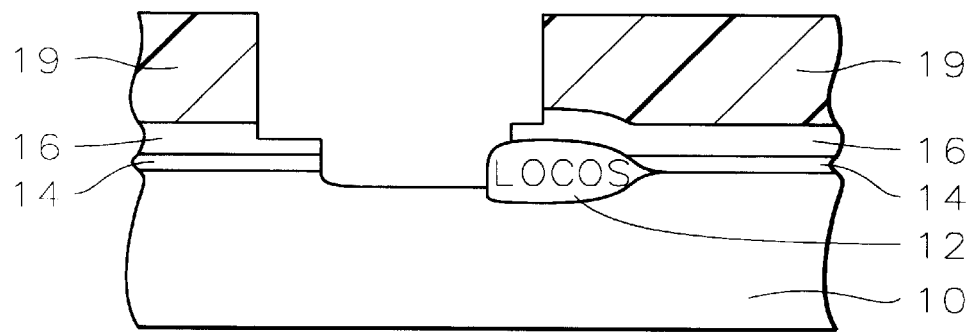

Now, the gate oxide layer within the opening 21 is etched away. The selectivity of the etchant to oxide with respect to silicon is reduced such that a portion of the polysilicon layer 16 within the opening is etched away. A portion of the semiconductor substrate within the opening is also etched away. The selectivity of oxide to silicon is about 3:1. The purpose of this reduced selectivity is to decrease the thickness of the polysilicon layer within the opening. This is illustrated in FIG. 4. The thickness of the thinner polysilicon layer 16 within the opening is now between about 80 and 150 Angstroms.

Figure 5:
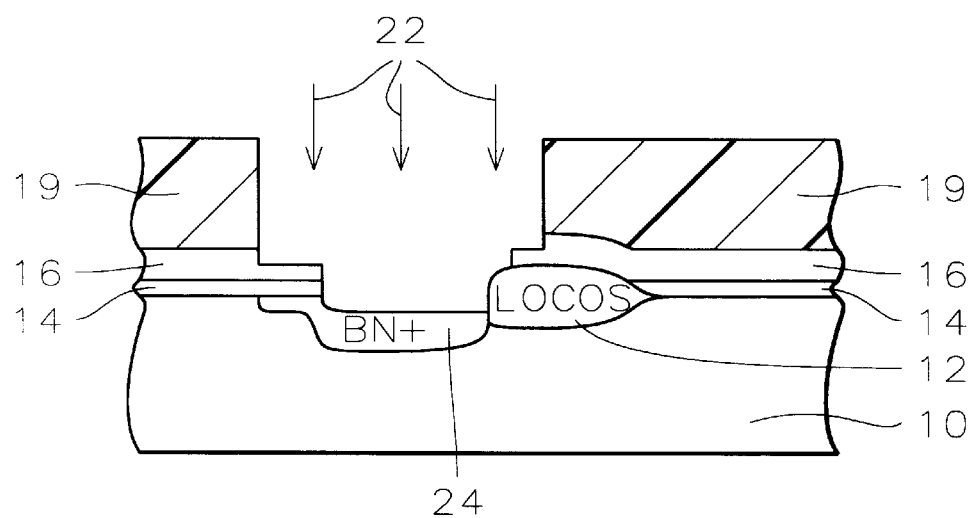

Now, referring to FIG. 5, a buried contact implantation is performed. Phosphorus ions are implanted with a dosage of between about 1 E 14 to 1 E 15 atoms/cm$^2$ at an energy of between about 50 and 60 KeV. This energy level is larger than the conventional energy level of between about 30 and 40 KeV. The increased energy preserves device and isolation performance.

Buried contact region 24 is formed. The region extends under the polysilicon and gate oxide exposed within the mask opening. Because the polysilicon thickness has been reduced, the low energy of the buried contact implantation is sufficient to propel the ions through the layers into the underlying substrate.

Figure 6:
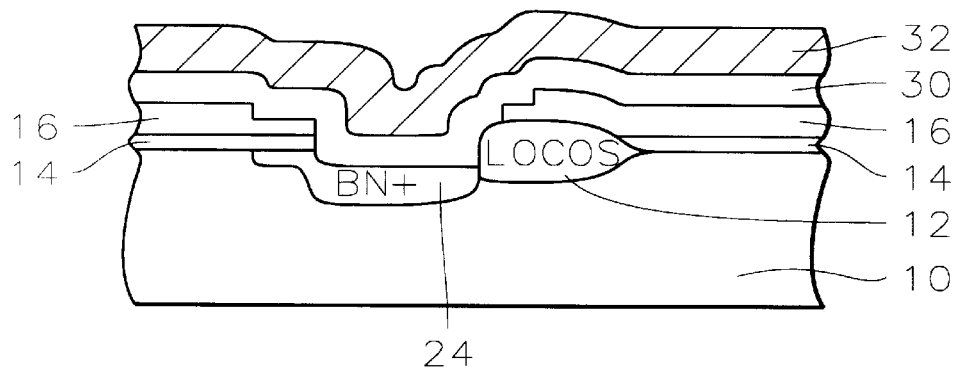

Referring now to FIG. 6, the second layer of the split polysilicon 30 is deposited by LPCVD to a thickness of between about 550 to 600 Angstroms. A silicide layer, such as tungsten silicide, 32 is deposited over the polysilicon layer 30 to a thickness of between about 1000 and 1100 Angstroms.

Figure 7:
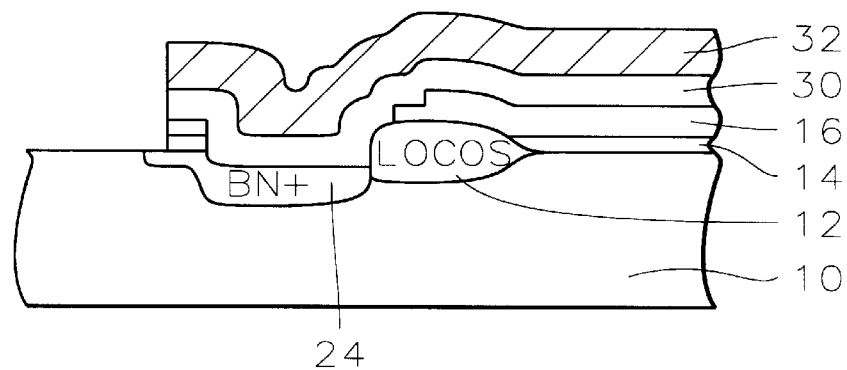

A photoresist mask, not shown, is formed over the silicide layer and the silicide and polysilicon layers 32 and 30, respectively, are etched away where they are not covered by the mask, as shown in FIG. 7. If this mask is misaligned, the thin portion of the polysilicon layer 16 will prevent a trench from being etched into the buried contact region.

Figure 8:
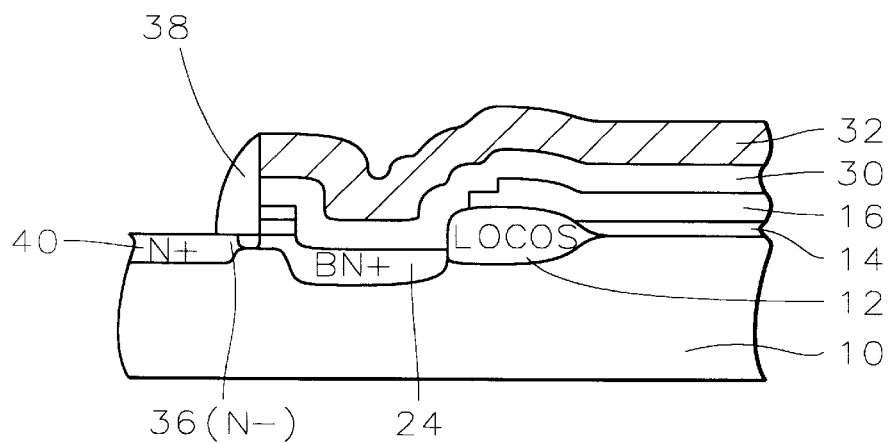
Figure 9:
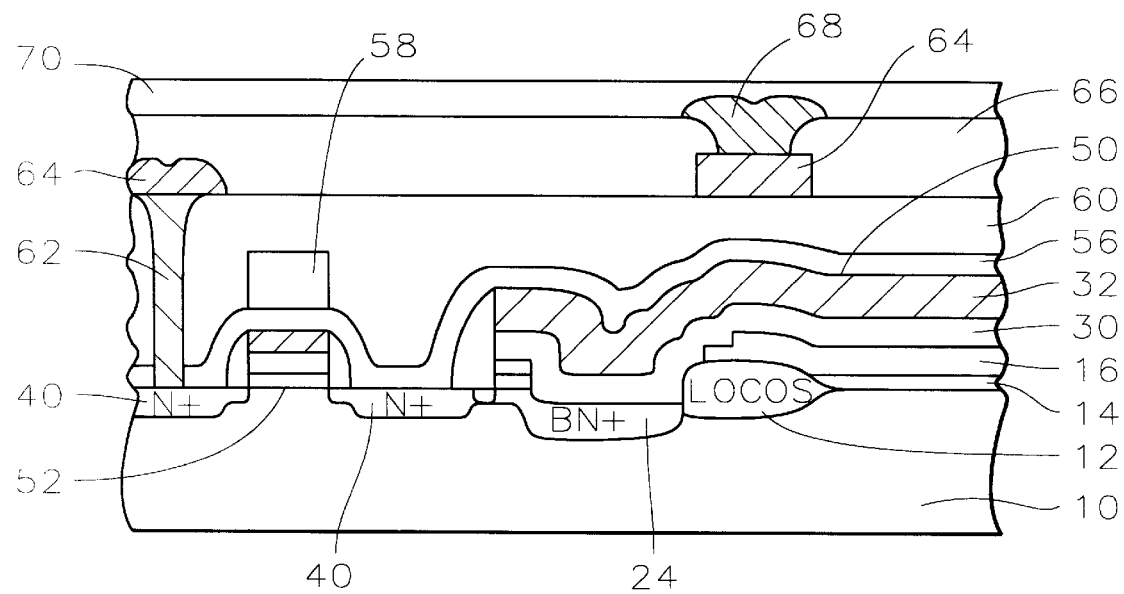
FIG. 9 schematically illustrates in cross-sectional representation a preferred embodiment of this invention for a static random access memory (SRAM).

Processing continues as is conventional in the art to form LDD regions 36, an oxide spacer 38, and source and drain regions 40, as illustrated in FIG. 8, and to complete the integrated circuit device. This approach can be directly applied to static random access memory (SRAM) buried contacts or to any device utilizing a buried contact for connecting polysilicon and the semiconductor substrate. A SRAM is illustrated in FIG. 9. Elongated polysilicon contact 50 and gate 52 are shown. Buried contact 24 and source and drain regions 40, which may be N+ or P+, are shown within the semiconductor substrate. The first polysilicon contact 50 and gate 52 have been covered with an interpoly oxide 56 and a second polysilicon layer 58 has been patterned and covered by an interlevel dielectric 60. A contact opening has been made to source/drain region 40 and filled with, for example, a tungsten plug 62 and aluminum metallurgy 64. Intermetal dielectric layer 66 and second level metallurgy 68 are covered by passivation layer 70 to complete the fabrication of the integrated circuit.

The process of the present invention avoids a buried contact trench and the associated junction leakage and sheet resistance. Sheet resistance is also reduced by the high energy implantation of the buried contact region through the polysilicon and gate oxide layers. This is made possible by the widening of the photoresist opening and the modification of the polysilicon etch recipe so that the exposed polysilicon layer thickness is reduced.

While the invention has been particularly shown and described with reference to the preferred embodiments thereof, it will be understood by those skilled in the art that various changes in form and details may be made without departing from the spirit and scope of the invention.

What is claimed is:

1. A method of forming a buried contact in the fabrication of an integrated circuit device comprising:

providing a gate oxide layer over the surface of a semiconductor substrate;

depositing a first polysilicon layer over said gate oxide layer;

forming a photoresist mask over said first polysilicon layer having an opening over planned said buried contact;

etching away said first polysilicon layer not covered by said photoresist mask;

cutting away a portion of said photoresist mask at the edges of said opening to expose a portion of said first polysilicon layer at said edges;

etching away said gate oxide layer not covered by said mask wherein said etching has a reduced selectivity of oxide to silicon so that an upper portion of said first polysilicon layer exposed at said edges of said opening is etched away leaving a thinner first polysilicon layer at said edges of said opening;

implanting ions through said opening and through said thinner first polysilicon layer into said semiconductor substrate to form said buried contact;

removing said photoresist mask; and depositing a second polysilicon layer overlying said first polysilicon layer and said buried contact to complete said formation of said buried contact in said fabrication of said integrated circuit device.

2. The method according to claim 1 wherein said first polysilicon layer has a thickness of between about 500 and 600 Angstroms.

3. The method according to claim 1 wherein said step of cutting away a portion of said photoresist mask is performed using a chemical treatment.

4. The method according to claim 1 wherein said photoresist mask is cut away about 0.05 microns on either side of said opening.

5. The method according to claim 1 wherein said reduced etching selectivity of oxide to silicon is about 3:1.

6. The method according to claim 1 wherein said thinner first polysilicon layer has a thickness of between about 80 and 150 Angstroms.

7. The method according to claim 1 wherein said step of implanting ions into said semiconductor substrate is performed at an increased energy of between about 50 and 60 KeV.

8. The method according to claim 1 wherein said second polysilicon layer has a thickness of between about 500 and 600 Angstroms.

9. The method according to claim 1 further comprising depositing a silicide layer overlying said second polysilicon layer.

10. The method according to claim 1 further comprising:

patterning said second polysilicon layer, said first polysilicon layer, and said gate oxide layer to form a polysilicon contact to said buried contact and to form a gate electrode on the surface of said semiconductor substrate; and forming source and drain regions in said semiconductor substrate associated with said gate electrode wherein one of said source and drain regions is adjacent to said buried contact.

11. A method of forming a buried contact in the fabrication of an integrated circuit device comprising:

provinding a gate oxide layer over the surface of a semiconductor substrate;

depositing a first polysilicon layer over said gate oxide layer;

forming a photoresist mask over said first polysilicon layer having an opening over planned said buried contact;

etching away said first polysilicon layer not covered by said photoresist mask;

cutting away a portion of said photoresist mask at the edges of said opening to expose a portion of said first polysilicon layer at said edges;

etching away said gate oxide layer not covered by said mask wherein said etching has a reduced selectivity of oxide to silicon so that an upper portion of said first polysilicon layer exposed at said edges of said opening is etched away leaving a thinner first polysilicon layer at said edges of said opening;

implanting ions through said opening and through said thinner first polysilicon layer into said semiconductor substrate to form said buried contact wherein said implanting is performed at an increased energy of between about 50 and 60 KeV;

removing said photoresist mask;

depositing a second polysilicon layer overlying said first polysilicon layer and said buried contact;

depositing a sulicide layer overlying said second polysilicon layer;

patterning said silicide layer, said second polysilicon layer, said first polysilicon layer, and said gate oxide layer to form a contact to said buried contact and a gate electrode; and implanting source and drain regions within said semiconductor substrate adjacent to said gate electrode wherein one of said source and drain regions is adjacent to said semiconductor substrate to complete said formation of said buried contact in said fabrication of said integrated circuit device.

12. The method according to claim 11 wherein said first polysilicon layer has a thickness of between about 500 and 600 Angstroms.

13. The method according to claim 11 wherein said step of cutting away a portion of said photoresist mask is performed by a chemical treatment and wherein said photoresist mask is cut away from said edges of said opening by about 0.05 microns.

14. The method according to claim 11 wherein said reduced etching selectivity of oxide to silicon is about 3:1.

15. The method according to claim 11 wherein said thinner first polysilicon layer has a thickness of between about 80 and 150 Angstroms.

16. The method according to claim 11 wherein said second polysilicon layer has a thickness of between about 500 and 600 Angstroms.

17. A method of forming a buried contact in the fabrication of an integrated circuit device comprising:

providing a gate oxide layer over the surface of a semiconductor substrate;

depositing a first polysilicon layer over said gate oxide layer;

forming a photoresist mask over said first polysilicon layer having an opening over planned said buried contact;

etching away said first polysilicon layer not covered by said photoresist mask;

cutting away about a 0.05 micron portion of said photoresist mask at the edges of said opening to expose a portion of said first polysilicon layer at said edges;

etching away said gate oxide layer not covered by said mask wherein said etching has a reduced selectivity of oxide to silicon of about 3:1 so that an upper portion of said first polysilicon layer exposed at said edges of said opening is etched away leaving a thinner first polysilicon layer at said edges of said opening;

implanting ions through said opening and through said thinner first polysilicon layer into said semiconductor substrate to form said buried contact wherein said implanting is performed at an increased energy of between about 50 and 60 KeV;

removing said photoresist mask;

depositing a second polysilicon layer overlying said first polysilicon layer and said buried contact;

depositing a silicide layer overlying said second polysilicon layer;

patterning said silicide layer, said second polysilicon layer, said first polysilicon layer, and said gate oxide layer to form a contact to said buried contact and a gate electrode; and implanting source and drain regions within said semiconductor substrate adjacent to said gate electrode wherein one of said source and drain regions is adjacent to said semiconductor substrate to complete said formation of said buried contact in said fabrication of said integrated circuit device.

18. The method according to claim 17 wherein said first polysilicon layer has a thickness of between about 500 and 600 Angstroms.

19. The method according to claim 17 wherein said thinner first polysilicon layer has a thickness of between about 80 and 150 Angstroms.

20. The method according to claim 17 wherein said second polysilicon layer has a thickness of between about 500 and 600 Angstroms.

* * * * *